United States Patent
Kobayashi et al.

(10) Patent No.: US 9,105,821 B2
(45) Date of Patent: Aug. 11, 2015

(54) CURABLE SILICONE RESIN COMPOSITION, CURED PRODUCT THEREOF AND PHOTOSEMICONDUCTOR APPARATUS

(71) Applicant: SHIN-ETSU CHEMICAL CO., LTD., Tokyo (JP)

(72) Inventors: Yukito Kobayashi, Annaka (JP); Mitsuhiro Iwata, Takasaki (JP); Satoshi Onai, Takasaki (JP)

(73) Assignee: SHIN-ETSU CHEMICAL CO., LTD., Annaka-Shi, Gunma (JP)

( * ) Notice: Subject to any disclaimer, the term of this patent is extended or adjusted under 35 U.S.C. 154(b) by 0 days.

(21) Appl. No.: 14/096,668

(22) Filed: Dec. 4, 2013

(65) Prior Publication Data

US 2014/0175504 A1    Jun. 26, 2014

(30) Foreign Application Priority Data

Dec. 21, 2012   (JP) .................. 2012-279236
Sep. 13, 2013   (JP) .................. 2013-190680

(51) Int. Cl.
| | | |
|---|---|---|
| C08K 5/5415 | (2006.01) | |
| H01L 33/56 | (2010.01) | |
| C08G 77/24 | (2006.01) | |
| C08L 83/08 | (2006.01) | |
| C08G 77/12 | (2006.01) | |
| C08G 77/20 | (2006.01) | |

(52) U.S. Cl.
CPC ............... *H01L 33/56* (2013.01); *C08G 77/24* (2013.01); *C08L 83/08* (2013.01); *C08G 77/12* (2013.01); *C08G 77/20* (2013.01); *H01L 2224/45144* (2013.01); *H01L 2224/48091* (2013.01); *H01L 2224/73265* (2013.01)

(58) Field of Classification Search
CPC ......... C08L 83/00; C08L 83/08; C08G 77/24; H01L 33/56
USPC ................................ 524/269, 866
See application file for complete search history.

(56) References Cited

U.S. PATENT DOCUMENTS

| | | |
|---|---|---|
| 4,528,390 A | 7/1985 | Kimura |
| 5,538,793 A | 7/1996 | Inokuchi et al. |
| 2002/0161140 A1 | 10/2002 | Yoneda et al. |
| 2004/0116640 A1 | 6/2004 | Miyoshi |
| 2006/0073347 A1 | 4/2006 | Morita et al. |
| 2007/0073025 A1 | 3/2007 | Arai |
| 2007/0112147 A1 | 5/2007 | Morita et al. |

FOREIGN PATENT DOCUMENTS

| | | |
|---|---|---|
| JP | A-40-16917 | 8/1965 |
| JP | A-54-72300 | 6/1979 |
| JP | A-60-13813 | 1/1985 |
| JP | A-03-244636 | 10/1991 |
| JP | A-4-88023 | 3/1992 |
| JP | A-7-196815 | 8/1995 |
| JP | A-11-1619 | 1/1999 |
| JP | A-2002-265787 | 9/2002 |
| JP | A-2004-186168 | 7/2004 |
| JP | A-2006-321832 | 11/2006 |
| JP | A-2006-339581 | 12/2006 |
| JP | A-2007-077252 | 3/2007 |
| JP | A-2007-126609 | 5/2007 |
| JP | A-2008-45039 | 2/2008 |
| JP | A-2008-159713 | 7/2008 |
| JP | A-2008-192880 | 8/2008 |
| JP | A-2011-184625 | 9/2011 |
| KR | 2005-0072123 A | 7/2005 |
| TW | 200524987 A | 8/2005 |

OTHER PUBLICATIONS

Jan. 27, 2015 Taiwanese Office Action issued in Taiwanese Applicaiton No. 102147553.
May 14, 2015 Office Action issued in Korean Application No. 10-2013-0159183.

*Primary Examiner* — Edward Cain
(74) *Attorney, Agent, or Firm* — Oliff PLC (57) ABSTRACT

The present invention is curable silicone resin composition which is an addition-curable silicone composition, and comprises:

(A)
  (A-1) a compound having at least two aliphatic unsaturated groups per one molecule and represented by the following formula (1),

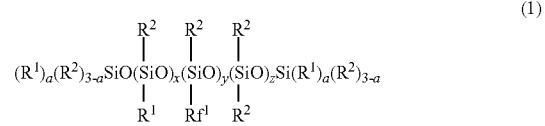

(B) an organic silicon compound having at least two hydrogen atoms bonded to silicon atom per one molecule and having no aliphatic unsaturated group,
(C) a hydrosilylation catalyst containing a platinum group metal, and
(D) 0.1 to 500 parts by mass of silicone powder having an average particle diameter of 0.5 to 100 μm based on 100 parts by mass of the total Components (A) and (B).

Thereby, there can be provided a curable silicone resin composition having high light extraction efficiency and useful as, for example, an encapsulant, a cured product thereof and a photosemiconductor apparatus.

19 Claims, 1 Drawing Sheet

Fig. 1

CURABLE SILICONE RESIN COMPOSITION, CURED PRODUCT THEREOF AND PHOTOSEMICONDUCTOR APPARATUS

TECHNICAL FIELD

The present invention relates to a curable silicone resin composition, a cured product thereof and a photosemiconductor apparatus.

BACKGROUND ART

As an encapsulating material of an LED device, an epoxy resin has generally been used. However, modulus of elasticity of the epoxy resin is high, so that under stress by temperature cycles, a bonding wire may be disconnected or cracks may generate at the epoxy resin in some cases. Also, because of the stress that the epoxy resin gives to the LED device, a crystal structure of a semiconductor material collapses and lowering in luminous efficiency is concern.

As a measure thereof, a method of using a silicone-modified organic resin, a method of adding silicone fine particles to the epoxy resin, etc., have been proposed (see Patent Literature 1 and Patent Literature 2). However, these methods use encapsulants containing an organic component with a larger amount, the cured composition causes cracking by the UV light having a short wavelength emitted from the photosemiconductor, and yellowing proceeds when it is used for a long period of term which leads lowering in brightness of the LED apparatus with a lapse of time.

Further, as a flexible encapsulant containing no organic component, it has been proposed to use a silicone resin (for example, see Patent Literature 3 to 5). The silicone resin is excellent in heat resistance, weather resistance and color fastness as compared with those of the epoxy resin. In particular, it is excellent in transparency, optical characteristics, etc., as compared with the other organic materials such as the epoxy resin, etc., so that, in recent years, it has been increasingly used mainly in a blue LED and a white LED. Further, in the silicone resin composition having a flexible molecular structure, it has a rubber elasticity with a wide range from low temperature to high temperature, so that it can effectively suppress crack against thermal shock, whereby an LED apparatus having high reliability with a long term can be obtained.

On the other hand, such a silicone resin material generally has a tack (tackiness), and is a rubber material so that the material strength is weak. For the purpose of supplementing the above, it has been generally known that improvement in strength of the material and improvement of tackiness can be done by adding a filler.

A resin composition for encapsulating a photosemiconductor having high hardness and heightened impact resistance has been proposed by formulating a fine particulate high molecular weight polyorganosilsesquioxane having an average particle diameter of 100 nm or less to a silicone resin composition (see Patent Literature 6).

Also, a resin composition for encapsulating a photosemiconductor having high hardness and heightened impact resistance has been proposed similarly by adding silicone series polymer particles having a silicone core-alkoxysilane condensate shell structure in which silicone particles having an average particle diameter of 0.001 to 1.0 μm is coated by an alkoxysilane condensate to a silicone resin composition (see Patent Literature 7 and 8, etc.).

Further, there is a prior art technique in which silicone fine particles are filled in a silicone resin composition for the purpose of improvement in strength of a material and improvement in light extraction efficiency (see Patent Literature 9 to 11).

CITATION LIST

Patent Literature

PATENT LITERATURE 1: JP 2007-077252A
PATENT LITERATURE 2: JP 2008-192880A
PATENT LITERATURE 3: JP Hei. 11-1619A
PATENT LITERATURE 4: JP 2002-265787A
PATENT LITERATURE 5: JP 2004-186168A
PATENT LITERATURE 6: JP 2006-321832A
PATENT LITERATURE 7: JP 2007-126609A
PATENT LITERATURE 8: JP 2008-045039A
PATENT LITERATURE 9: JP 2006-339581A
PATENT LITERATURE 10: JP 2008-159713A
PATENT LITERATURE 11: JP 2011-184625A

SUMMARY OF THE INVENTION

Technical Problem

The silicone fine particles having a small average particle diameter as used in the above-mentioned inventions have, however, a large specific surface area, so that these particles are likely discolored by oxidation at high temperatures. On the other hand, in recent years, due to increase in the exothermic amount from an LED device which is further highly brightness, a surface temperature of the LED device at the time of driving is estimated to reach to 150° C. In such a situation, when a silicone encapsulant containing silicone fine particles having a small particle diameter is used, discoloration of the encapsulant proceeds rapidly by oxidation of the silicone fine particles, and the light emitted from the photosemiconductor is shielded by the discolored encapsulant whereby the problem that the light becomes dark is generated. This means that a lifetime of the LED apparatus is shortened and there is the defect that heat resistance thereof for a long period of time is inferior. Further, at the reflow process in the fabrication, cracks of the resin are generated due to heat shock by exposing to high temperatures, and there is the problem that it is inferior in reliability as the product.

The above-mentioned prior art techniques were not excellent in light extraction efficiency, and could not suppress generation of cracks at the reflow process.

That is, an encapsulating material for a photosemiconductor device such as an LED device, etc., having high light extraction efficiency, and in particular, capable of suppressing generation of cracks at the time of heating at the reflow process, with high reliability has been strongly demanded.

The present invention has been accomplished in view of the above-mentioned circumstances and an object thereof is to provide a curable silicone resin composition, a cured product thereof and a photosemiconductor apparatus, having high light extraction efficiency and capable of suppressing generation of cracks, with high reliability and useful for, for example, an encapsulant.

Solution to Problem

The present invention has been accomplished to solve the above-mentioned problems, and
provides a curable silicone resin composition which is an addition-curable silicone composition comprising, (A)

(A-1) a compound having at least two aliphatic unsaturated groups in one molecule and represented by the following formula (1), wherein $R^1$ represents an aliphatic unsaturated group, $R^2$s may be the same or different from each other and each represent a substituted or unsubstituted monovalent hydrocarbon group having 1 to 8 carbon atoms other than an aliphatic unsaturated group, $Rf^1$ represents a $CF_3$—$(CF_2)_m$—$(CH_2)_n$— group, where "m" represents an integer of 0 or more, and "n" represents an integer of 1 or more, "a" represents an integer of 1 to 3, and "x", "y" and "z" each an integer of x≥0, y≥1 and z≥0, respectively, (B) an organic silicon compound having at least two hydrogen atoms bonded to silicon atom per one molecule and having no aliphatic unsaturated group, (C) a hydrosilylation catalyst containing a platinum group metal, and (D) 0.1 to 500 parts by mass of silicone powder having an average particle diameter of 0.5 to 100 µm based on 100 parts by mass of the total Components (A) and (B).

Such a curable silicone resin composition of the present invention can provide a cured product which can suppress generation of cracks at the reflow process, and has high reliability and high light extraction efficiency, and can be used suitably as an encapsulant for a photosemiconductor device (optical device).

Also, Component (A) preferably further contains, in addition to Component (A-1), (A-2) an organopolysiloxane having two or more aliphatic unsaturated groups bonded to a silicon atom and one or more $CF_3$—$(CF_2)_m$—$(CH_2)_n$— groups bonded to a silicon atom in one molecule, and having a branched structure of a siloxane unit represented by $SiO_{4/2}$ and/or $RSiO_{3/2}$, where "m" and "n" have the same meanings as defined above, R represents a substituted or unsubstituted monovalent hydrocarbon group, and when there are a plural number of siloxane units having R, then Rs may be the same or different groups from each other.

Such a curable silicone resin composition of the present invention containing Component (A) is preferred since the obtained cured product has excellent hardness.

Also, the above-mentioned Component (D) is preferably silicone powder containing a polyorganosilsesquioxane resin.

Such a curable silicone resin composition of the present invention containing Component (D) is convenient since higher light extraction efficiency and high reliability at the reflow process can be provided.

Further, in the above-mentioned $CF_3$—$(CF_2)_m$—$(CH_2)_n$— group, it is preferred that m=0 and n=2.

Such a curable silicone resin composition of the present invention is convenient since it is excellent in the point of synthesis.

Component (B) is further preferably an organohydrogen polysiloxane represented by the following average compositional formula (2), $$R^3{}_{a'}H_bSIO_{(4-a'-b)/2} \qquad (2)$$

wherein $R^3$'s may be the same or different from each other, and each represent a substituted or unsubstituted silicon atom-bonded monovalent hydrocarbon group other than an aliphatic unsaturated group, and "a'" and "b" are each a positive number satisfying 0.7≤a'≤2.1, 0.001≤b≤1.0, and 0.8≤a'+b≤3.0.

Such a Component (B) is convenient since it acts as a cross-linking agent more suitably.

Moreover, the above-mentioned curable silicone resin composition is a material to be used for encapsulating a photosemiconductor device.

Such a curable silicone resin composition is suitable as a material for encapsulating a photosemiconductor device, which can provide high reliability at the reflow process and has excellent light extraction efficiency.

Furthermore, the present invention is to provide a cured product obtained by curing the above-mentioned curable silicone resin composition.

Such a cured product can be suitably used as a cured product which can suppress generation of cracks at the time of heating at the reflow process with giving high reliability and excellent light extraction efficiency.

It is to provide a photosemiconductor apparatus which can be obtained by encapsulating a photosemiconductor device by using the above-mentioned curable silicone resin composition, and curing by heating.

Such a photosemiconductor apparatus gives a photosemiconductor apparatus having good light extraction efficiency and high reliability.

Advantageous Effects of Invention

The curable silicone resin composition of the present invention is to provide a cured product having high light extraction efficiency, and high reliability at the reflow process. Accordingly, it is useful as a material for a photosemiconductor apparatus, a material for an optical apparatus or optical parts, an insulating material for an electronic apparatus or electronic parts, and a coating material, etc., having high reliability.

DESCRIPTION OF EMBODIMENTS

The present inventors has carried out to accomplish the above-mentioned objects, and as a result, they have found that a curable silicone resin composition which is an addition-curable silicone composition, and comprises (A)

(A-1) a compound having at least two aliphatic unsaturated groups per one molecule and represented by the following formula (1), wherein R¹ represents an aliphatic unsaturated group, R²s may be the same or different from each other and each represent a substituted or unsubstituted monovalent hydrocarbon group having 1 to 8 carbon atoms other than an aliphatic unsaturated group, $Rf^1$ represents a $CF_3-(CF_2)_m-(CH_2)_n-$ group, where "m" represents an integer of 0 or more, and "n" represents an integer of 1 or more, "a" represents an integer of 1 to 3, and "x", "y" and "z" each an integer of x≥0, y≥1 and z≥0, respectively, (B) an organic silicon compound having at least two hydrogen atoms bonded to silicon atom per one molecule and having no aliphatic unsaturated group, (C) a hydrosilylation catalyst containing a platinum group metal, and (D) 0.1 to 500 parts by mass of silicone powder having an average particle diameter of 0.5 to 100 μm based on 100 parts by mass of the total Components (A) and (B), can accomplish the above-mentioned objects.

According to the curable silicone resin composition of the present invention, a cured product which can suppress cracks at the time of heating at the reflow process, and has high reliability and high light extraction efficiency can be provided. That is, by using the addition-curable silicone composition of the present invention as an encapsulant for a photosemiconductor device (optical device), it can be made excellent in reliability at the reflow process, and high light extraction efficiency can be realized. Also, emission from the photosemiconductor device can be suppressed the total reflection by the above-mentioned surface of the cured product which is highly transparent and low refractive index, so that brightness of the photosemiconductor device, in particular, an LED device can be improved.

In the combination of the above-mentioned Component (A) to Component (D) of the present invention, the particle diameter of the silicone powder is large so that the specific surface area becomes small, and the powder difficulty discolored by oxidation at high temperatures. Accordingly, in recent years, according to increase in an exothermic amount from an LED device (photosemiconductor device) which is further highly brightness, even in the circumstance where the surface temperature of the LED device at the time of driving becomes higher temperature, when the silicone resin composition containing silicone powder (silicone fine particles) having a large particle diameter is used as the silicone encapsulant as in the present invention, discoloration of the encapsulant by oxidation of the silicone powder difficultly proceeds, so that the product is excellent in light extraction efficiency, and becomes excellent in reliability at the reflow process.

In the following, the present invention is explained in detail.

[Curable Silicone Resin Composition]

<Component (A)>

(A-1) is a compound having at least two aliphatic unsaturated groups per one molecule and represented by the following formula (1), (1)

wherein R¹ represents an aliphatic unsaturated group, R²s may be the same or different from each other and each represent a substituted or unsubstituted monovalent hydrocarbon group having 1 to 8 carbon atoms other than an aliphatic unsaturated group, $Rf^1$ represents a $CF_3-(CF_2)_m-(CH_2)_n-$ group, where "m" represents an integer of 0 or more, and "n" represents an integer of 1 or more, "a" represents an integer of 1 to 3, and "x", "y" and "z" each an integer of x≥0, y≥1 and z≥0, respectively.

In Component (A-1), the aliphatic unsaturated group of R¹ in the above-mentioned formula (1) is preferably an alkenyl group, more preferably an alkenyl group having 2 to 10 carbon atoms, particularly 2 to 6 carbon atoms such as a vinyl group, an allyl group, an ethynyl group, etc., particularly preferably a vinyl group.

The substituted or unsubstituted monovalent hydrocarbon group having 1 to 8 carbon atoms other than an aliphatic unsaturated group of R² may be exemplified by an alkyl group such as a methyl group, an ethyl group, a propyl group, a butyl group, etc.; a cycloalkyl group such as a cyclohexyl group, a cyclopentyl group, etc.; an aryl group such as a phenyl group, a tolyl group, a xylyl group, etc.; an aralkyl group such as a benzyl group, a phenyl-ethyl group, etc.; and a halogenated hydrocarbon group such as a chloromethyl group, a chloropropyl group, a chlorocyclohexyl group, etc. It is preferably a substituted or unsubstituted monovalent hydrocarbon group having 1 to 6 carbon atoms, and particularly preferred is a methyl group.

$Rf^1$ is defined to be $CF_3-(CF_2)_m-(CH_2)_n-$ ("m" represents an integer of 0 or more, and "n" represents an integer of 1 or more). "m" is preferably an integer satisfying 0≤m≤9, "n" is preferably an integer satisfying 1≤n≤10. When a plural number of $Rf^1$s are present (in the case where "y" represents 2 or more), each may be the same groups or may be different groups.

In the present invention, particularly preferred in the point of synthesis are $CF_3-(CH_2)_2-$, $CF_3-(CF_2)_3-(CH_2)_2-$ and $CF_3-(CF_2)_5-(CH_2)_2-$ groups, and among these, $CF_3-(CH_2)_2-$ where m=0 and n=2 in the above formula is further preferred.

In Component (A-1), "x" represents an integer of 0 or more, preferably an integer of 0 to 50, "y" represents an integer of 1 or more, preferably an integer of 2 to 5,000, more preferably an integer of 5 to 1,000. "z" represents an integer of 0 or more, preferably an integer of 0 to 10,000, more preferably an integer of 0 to 5,000. x+y+z is preferably 5 to 10,000, more preferably 10 to 3,000, particularly preferably 20 to 500. Also, the value y/(x+y+z) is preferably in the range of 1/50 to 1/1, more preferably 1/10 to 1/1, particularly preferably in the range of 1/5 to 1/1 is suitable.

The organopolysiloxane of Component (A-1) is suitably a viscosity at 25° C. in the range of 100 to 10,000,000 mPa·s, particularly in the range of 200 to 500,000 mPa·s, and these organopolysiloxanes may be used a single kind alone or two or more kinds in combination. Incidentally, the viscosity is a viscosity measured by a rotational viscometer.

The organopolysiloxane of Component (A-1) can be prepared by the conventionally known method. For example, it can be obtained by reacting a cyclotrisiloxane represented by the following formula (i), a cyclotrisiloxane represented by the following formula (ii) and an organosiloxane represented by the following formula (iii), and if necessary, a cyciotrisiloxane represented by the following formula (iv) are copolymerized in the presence of an alkali or an acid catalyst, (i)

(ii)

$(R^1)_a(R^2)_{3-a}SiOSi(R^1)_a(R^2)_{3-a}$ (iii)

(iv)

wherein $R^1$, $R^2$, $Rf^1$ and a are as defined above.

Component (A-2)

In the curable silicone resin composition to be used in the present invention, it is preferred to add Component (A-2) to the above-mentioned Component (A-1) to make the hardness of the resulting cured product more excellent.

Component (A-2) to be used has two or more aliphatic unsaturated groups bonded to a silicon atom and one or more $CF_3$—$(CF_2)_m$—$(CH_2)_n$— group bonded to a silicon atom in one molecule, and is an organopolysiloxane having a branched structure of the siloxane unit represented by $SiO_{4/2}$ and/or $RSiO_{3/2}$. ("m" represents an integer of 0 or more, and "n" represents an integer of 1 or more. R represents a substituted or unsubstituted monovalent hydrocarbon group, and when there are a plural number of siloxane units having R, then Rs may be the same or different groups from each other.)

The organopolysiloxane of Component (A-2) contains a branched structure comprising a $SiO_{4/2}$ unit and/or a $RSiO_{3/2}$ unit as essential element, and it may further contain a $R_2SiO_{2/2}$ unit such as a methylvinylsiloxy unit, a dimethylsiloxy unit, etc., and a $R_3SiO_{1/2}$ unit such as a dimethylvinylsiloxy unit, a trimethylsiloxy unit, etc., (wherein R is as defined above).

Contents of the $SiO_{4/2}$ unit and/or the $RSiO_{3/2}$ unit are preferably 5 mole % or more, more preferably 10 mole to 95 mole %, particularly preferably 25 to 80 mole % based on the whole siloxane unit in the organopolysiloxane resin of Component (A-2).

Also, the organopolysiloxane is preferably those having a weight average molecular weight in the range of 500 to 100,000 in the point of isolation.

<Component (B)>

Component (B) is an organic silicon compound (SiH group-containing organic silicon compound) having at least two hydrogen atoms bonded to a silicon atom (i.e., an SiH group) per one molecule and having no aliphatic unsaturated group, and acts as a cross-linking agent by subjecting to hydrosilylation addition reaction with Component (A). Component (B) may be used a single kind alone or two or more kinds in combination.

Component (B) can be used any conventionally known compounds so long as it is an organic silicon compound having at least two hydrogen atoms bonded to a silicon atom (i.e., an SiH group) per one molecule and having no aliphatic unsaturated group, and there may be mentioned, for example, organohydrogen polysiloxane, organohydrogen silanes, an organic oligomer or an organic polymer.

The organic group bonded to a silicon atom of Component (B) does not have an aliphatic unsaturated group, and is an unsubstituted monovalent hydrocarbon group or a monovalent hydrocarbon group substituted by a halogen atom (for example, a chlorine atom, a bromine atom, a fluorine atom), an epoxy group-containing group (for example, an epoxy group, a glycidyl group, a glycidoxy group), or an alkoxy group (for example, a methoxy group, an ethoxy group, a propoxy group, a butoxy group), etc. Such a monovalent hydrocarbon group may be mentioned an alkyl group having 1 to 6 carbon atoms, an aryl group having 6 to 10 carbon atoms, more preferably a methyl group or an ethyl group, or a group in which these groups are substituted by a substituent(s) exemplified above. Also, when it has an epoxy group-containing group and/or an alkoxy group as a substituent(s) of the monovalent hydrocarbon group, adhesiveness can be provided to the cured product of the curable silicone resin composition of the present invention.

Further, the substituent defined by $CF_3$—$(CF_2)_m$—$(CH_2)_n$— ("m" represents an integer of 0 or more, and "n" represents an integer of 1 or more) in the above-mentioned Components (A-1) and (A-2) is preferably incorporated into Component (B), since emission from the photosemiconductor device becomes further highly transparent, and total reflection can be suppressed by the surface of the above-mentioned cured product whereby brightness of the LED is particularly improved. In the present invention, particularly preferred in the point of synthesis are $CF_3$—$(CH_2)_2$—, $CF_3$—$(CF_2)_3$—$(CH_2)_2$— and $CF_3$—$(CF_2)_5$—$(CH_2)_2$— groups.

Component (B) is not specifically limited in the molecular structure of the organic silicon compound so long as it is an organic silicon compound having at least two SiH groups per one molecule, and can be used various kinds of the organic silicon compounds conventionally been produced, for example, a linear, a cyclic, a branched, or a three-dimensional network structure (resinous state), etc.

The organic silicon compound of Component (B) has at least two (in general, 2 to 300 or so), preferably three or more (in general, 3 to 200, preferably 4 to 100 or so) SiH groups in one molecule. When the organic silicon compound of Component (B) has a linear structure or a branched structure, these SiH groups may be positioned either of the terminals of the molecular chain or the non-terminal portion of the molecular chain, or may be positioned both of them.

A number (polymerization degree) of the silicon atom in one molecule of the organic silicon compound of Component (B) is preferably 2 to 1,000, more preferably 3 to 200, further more preferably 4 to 100 or so. Moreover, the organic silicon compound of Component (B) is preferably a liquid state at 25° C., and a viscosity at 25° C. measured by a rotational viscometer is preferably 1 to 1,000 mPa·s, more preferably 10 to 100 mPa·s or so.

The organic silicon compound of Component (B) may be used, for example, that represented by the following average compositional formula (2), $$R^3{}_{a'}H_bSiO_{(4-a'-b)/2} \qquad (2)$$

wherein $R^3$s may be the same or different from each other, and each represent a substituted or unsubstituted silicon atom-bonded monovalent hydrocarbon group other than an aliphatic unsaturated group, and "a'" and "b" are each positive integer satisfying $0.7 \leq a' \leq 2.1$, $0.001 \leq b \leq 1.0$, and $0.8 \leq a'+b \leq 3.0$, preferably $1.0 \leq a' \leq 2.0$, $0.01 \leq b \leq 1.0$, and $1.5 \leq a'+b \leq 2.5$.

A substituted or unsubstituted monovalent hydrocarbon group bonded to the silicon atom, other than the aliphatic unsaturated group of $R^3$ may be mentioned a substituted or unsubstituted group such as an alkyl group or a haloalkyl group each having 1 to 6 carbon atoms, and an aryl group having 6 to 10 carbon atoms, etc., which are specifically exemplified as the above-mentioned unsubstituted or substituted monovalent hydrocarbon group other than the aliphatic unsaturated group. $R^3$ is preferably an alkyl group or a haloalkyl group each having 1 to 6 carbon atoms.

The organohydrogen polysiloxane represented by the above-mentioned average compositional formula (2) may be mentioned, for example, a cyclic compound containing at least four organohydrogen siloxane units represented by the formula: $R^3HSiO$, a compound represented by the formula: $R^3_2SiO(HR^3SiO)_cSiR^3_3$, a compound represented by the formula: $HR^3_2SiO(HR^3SiO)_cSiR^3_2H$, and a compound represented by the formula: $HR^3_2SiO(HR^3SiO)_c(R^3_2SiO)_dSiR^3_2H$, etc. In the above formulae, $R^3$ is as defined above, and "c" and "d" each represent at least 1.

Or else, the organohydrogen polysiloxane represented by the above-mentioned average compositional formula (2) may be a material containing a siloxane unit represented by the formula: $H_3SiO_{1/2}$, a siloxane unit represented by the formula: $R^3_2HSiO$ and/or a siloxane unit represented by the formula: $R^3_2HSiO_{1/2}$. The organohydrogen polysiloxane may contain a monoorganosiloxane unit, a diorganosiloxane unit, a triorganosiloxane unit and/or a $SiO_{4/2}$ unit each of which does not contain SiH group. $R^3$ in the above-mentioned formulae is as defined above.

Among the whole organosiloxane units contained in the organohydrogen polysiloxane represented by the above-mentioned average compositional formula (2), 30 to 100 mole % is preferably a methyl hydrogen siloxane unit.

When Component (B) is an organohydrogen polysiloxane having at least two SiH groups per one molecule, specific examples thereof may be mentioned 1,1,3,3-tetramethyl-disiloxane, 1,3,5,7-tetramethylcyclotetrasiloxane, tris(hydrogen dimethylsiloxy)methylsilane, tris(hydrogen dimethylsiloxy) phenylsilane, methyl hydrogen cyclopolysiloxane, methyl hydrogen siloxane-dimethylsiloxane cyclic copolymer, molecular chain both ends trimethylsiloxy group-sealed methyl hydrogen polysiloxane, molecular chain both ends trimethylsiloxy group-sealed dimethylsiloxane-methyl hydrogen siloxane copolymer, molecular chain both ends trimethylsiloxy group-sealed diphenylsiloxane.methyl hydrogen siloxane copolymer, molecular chain both ends trimethylsiloxy group-sealed methylphenylsiloxane.methyl hydrogen siloxane copolymer, molecular chain both ends trimethylsiloxy group-sealed dimethylsiloxane-methyl hydrogen siloxane.methylphenylsiloxane copolymer, molecular chain both ends trimethylsiloxy group-sealed dimethylsiloxane.methyl hydrogen siloxane.diphenylsiloxane copolymer, molecular chain both ends dimethyl hydrogen siloxy group-sealed methyl hydrogen polysiloxane, molecular chain both ends dimethyl hydrogen siloxy group-sealed dimethylpolysiloxane, molecular chain both ends dimethyl hydrogen siloxy group-sealed dimethylsiloxane.methyl hydrogen siloxane copolymer, molecular chain both ends dimethyl hydrogen siloxy group-sealed dimethylsiloxane-methylphenylsiloxane copolymer, molecular chain both ends dimethyl hydrogen siloxy group-sealed dimethylsiloxane-.diphenylsiloxane copolymer, molecular chain both ends dimethyl hydrogen siloxy group-sealed methylphenylpolysiloxane, molecular chain both ends dimethyl hydrogen siloxy group-sealed diphenylpolysiloxane, molecular chain both ends dimethyl hydrogen siloxy group-sealed diphenylsiloxane.methyl hydrogen siloxane copolymer, an organohydrogen polysiloxane in which a part or whole of the methyl group(s) in each of the above exemplary compounds is/are substituted by the other alkyl group such as an ethyl group, a propyl group, etc., an organosiloxane copolymer comprising a siloxane unit represented by the formula: $R^3_3SiO_{1/2}$, a siloxane unit represented by the formula: $R^3_2HSiO_{1/2}$ and a siloxane unit represented by the formula: $SiO_{4/2}$, an organosiloxane copolymer comprising a siloxane unit represented by the formula: $R^3_2HSiO_{1/2}$ and a siloxane unit represented by the formula: $SiO_{4/2}$, an organosiloxane copolymer comprising a siloxane unit represented by the formula: $R^3HSiO_{2/2}$ and either one of or both of a siloxane unit represented by the formula: $R^3SiO_{3/2}$ and a siloxane unit represented by the formula: $H_3SiO_{1/2}$, and a mixture comprising two or more kinds of these organopolysiloxanes. $R^3$ in the above-mentioned formulae has the same meaning as defined above.

A formulation amount of Component (B) may be an amount sufficient for curing the composition of the present invention in the presence of a hydrosilylation catalyst of Component (C), preferably such an amount that a molar ratio of the SiH group in Component (B) to the aliphatic unsaturated group in Component (A) of 0.2≤SiH group/aliphatic unsaturated group≤5.0, further preferably an amount of 0.5≤SiH group/aliphatic unsaturated group≤2.0.

<Component (C)>

Component (C) is a platinum group metal catalyst which is to promote the hydrosilylation addition reaction of Component (A) and Component (B).

As the platinum group metal catalyst of Component (C), any catalyst may be used so long as it promotes the hydrosilylation addition reaction of the silicon atom-bonded aliphatic unsaturated group in Component (A) and a SiH group in Component (B). Component (C) may be used a single kind alone or two or more kinds in combination. Component (C) may be mentioned, for example, a platinum group metal such as platinum, palladium, rhodium, etc.; a coordination compound of chloroplatinic acid, alcohol-modified chloroplatinic acid, chloroplatinic acid with olefins, vinylsiloxane or an acetylene compound; and a platinum group metal compound such as tetrakis(triphenylphosphine)palladium, chlorotris (triphenylphosphine)rhodium, etc., particularly preferably a platinum compound.

A formulation amount of Component (C) may be an effective amount as the hydrosilylation catalyst, and preferably in the range of 0.1 to 1000 ppm in terms of a mass as a platinum group metal element based on the total mass of Components (A) and (B), more preferably in the range of 1 to 500 ppm.

<Component (D)>

The curable silicone resin composition of the present invention is characterized in that it contains silicone powder (Component (D)) together with the above-mentioned Components (A) to (C).

The merits obtained by adding silicone powder as Component (D) are to improve light extraction efficiency and to provide high reliability at the reflow process. By adding silicone powder, a refractive index of the encapsulant is changed so that light extraction efficiency is improved, and mechanical characteristics against heat shock is improved whereby an encapsulating resin which can suppress cracks at the reflow process can be provided.

The silicone powder may be mentioned silicone resin powder which is polyorganosilsesquioxane fine powder as described in, for example, JP Sho. 40-16917B, JP Sho. 54-72300A, JP Sho. 60-13813A, JP Hei. 3-244636A and JP Hei. 4-88023A, and silicone complex powder having a structure in which polyorganosilsesquioxane fine powder (resin) is coated on the surface of silicone rubber powder as described in, for example, JP Hei. 7-196815A, etc.

The above-mentioned silicone powder may comprise a polyorganosilsesquioxane resin, or may be one which has a polyorganosilsesquioxane resin on a part or whole of the surface. These silicone powder may be used alone or two or more kinds in combination. The above-mentioned silicone powder can be prepared by the conventionally known methods, and also available as a commercial product.

Such a silicone powder has an average particle diameter within the range of 0.5 to 100 µm, preferably 1 to 15 µm. If the average particle diameter is less than 0.5 µm, when it is dispersed in the composition, agglomeration of the powders to each other likely generates, which results in lowering of strength of the resin cured product, and further, becomes a cause of discoloration by oxidation at heating accompanied by increase in the specific surface area, whereby there is a fear of causing lowering in heat discoloration resistance. Also, if the average particle diameter exceeds 100 µm, it is not preferred in the viewpoints of lowering in uniform dispersion in the cured product and in dispensing workability (specifically cobwebbing and clogging of a dispense nozzle). Incidentally, the above-mentioned average particle diameter can be obtained as a cumulative weight average value $D_{50}$ (or a median diameter) by the particle size distribution measurement using a laser diffraction.

Such a silicone powder may be mentioned, as silicone resin powder, for example, KMP590, KMP701, X-52-854 and X-52-1621 all available from Shin-Etsu Chemical Co., Ltd., and as silicone complex powder, for example, KMP600, KMP601, KMP602, KMP605 and X-52-7030 all available from Shin-Etsu Chemical Co., Ltd., but the invention is not limited to these.

An amount of such a silicone powder to be added is 0.1 to 500 parts by mass, preferably 1 to 100 parts by weight based on 100 parts by mass of the total of Components (A) and (B). If the amount to be added is less than 0.1 part by weight, high light extraction efficiency can be hardly obtained. If it exceeds 500 parts by weight, it is not preferred in the viewpoint that dispense workability is lowered.

<Other Components>

To the composition of the present invention, other optional components may be formulated other than the above-mentioned Components (A) to (C) and Component (D). Specific examples thereof may be mentioned as follows. These other components each may be used a single kind alone or two or more kinds in combination.

Aliphatic Unsaturated group-containing Compound Other than Component (A)

To the composition of the present invention, an aliphatic unsaturated group-containing compound which is subjected to addition reaction with Component (B) may be formulated other than Component (A). The aliphatic unsaturated group-containing compound other than Component (A) is preferably a material which participates in the formation of the cured product, and may be mentioned an organopolysiloxane having at least two aliphatic unsaturated groups per one molecule other than Component (A). The molecular structure may be either of, for example, a linear, a cyclic, a branched, a three dimensional network, etc.

In the present invention, it is possible to formula an aliphatic unsaturated group-containing organic compound other than the above-mentioned organopolysiloxane. Specific examples of the aliphatic unsaturated group-containing compound may be mentioned a monomer such as butadiene, a diacrylate derived from a polyfunctional alcohol, etc.; a polyolefin such as a copolymer of a polyethylene, a polypropylene or styrene and the other ethylenically unsaturated compound (for example, acrylonitrile or butadiene), etc.; and an oligomer or a polymer derived from a functional substituted organic compound such as an ester of acrylic acid, methacrylic acid or maleic acid, etc. The aliphatic unsaturated group-containing compound other than Component (A) may be a liquid or a solid at room temperature.

Addition Reaction Controller

An addition reaction controller can be formulated to the composition of the present invention to ensure a pot life. The addition reaction controller is not particularly limited so long as it is a compound having a curing controlling effect to the above-mentioned hydrosilylation catalyst of Component (C), and those conventionally known may be used. Specific examples thereof may be mentioned a phosphorus-containing compound such as triphenylphosphine, etc.; a nitrogen-containing compound such as tributylamine, tetramethylethylenediamine and benzotriazole, etc.; a sulfur-containing compound; an acetylene series compound such as an acetylene alcohol (for example, 1-ethynylcyclohexanol, 3,5-dimethyl-1-hexyn-3-ol), etc.; a compound containing two or more alkenyl groups; a hydroperoxy compound; a maleic acid derivative, etc.

A degree of the curing controlling effect by the above-mentioned addition reaction controller is different from each other based on the chemical structures of the addition reaction controllers. Accordingly, it is preferred to control the added amount to an optimum amount with respect to each of the addition reaction controller to be used. By adding an optimum amount of the addition reaction controller, the composition of the present invention becomes a material excellent in storage stability at room temperature for a long period of time and heat curability.

Silane Coupling Agent

In addition, the composition of the present invention may contain an adhesiveness providing agent to improve adhesiveness thereof. The adhesiveness providing agent may be exemplified by a silane coupling agent or its hydrolysis condensate, etc. The silane coupling agent may be exemplified by a known material such as an epoxy group-containing silane coupling agent, a (meth)acryl group-containing silane coupling agent, an isocyanate group-containing silane coupling agent, an isocyanurate group-containing silane coupling agent, an amino group-containing silane coupling agent, a mercapto group-containing silane coupling agent, etc., and may be used preferably in an amount of 0.1 to 20 parts by mass, more preferably 0.3 to 10 parts by mass based on the total 100 parts by mass of Component (A) and Component (B).

Other Optional Components

To suppress generation of coloring and degradation by oxidation of the cured product, etc., a conventionally known antioxidant such as 2,6-di-t-butyl-4-methylphenol, etc., may be formulated to the composition of the present invention. Also, to provide a resistivity against photodegradation, a photostabilizer such as a hindered amine series stabilizer, etc., may be formulated to the composition of the present invention. Further, an inorganic filler such as fumed silica, nano alumina, etc., may be formulated to the present invention composition to improve strength and suppress sedimentation of the particles, and if necessary, a dye, a pigment, a flame retardant, etc., may be formulated to the composition of the present invention.

[Cured Product]

The silicone composition of the present invention can be cured under the conventionally known curing conditions by the conventionally known curing method. More specifically, the composition can be generally cured by heating at 80 to 200° C., preferably 100 to 160° C. A heating time may be 0.5 minute to 5 hours or so, particularly 1 minute to 3 hours or so, and when precision is required such as for an LED encapsulating, etc., the curing time is preferably made longer. The form of the obtained cured product is not particularly limited, and may be either of, for example, a gel cured product, an elastomer cured product or a resin cured product.

[Photosemiconductor Apparatus]

The cured product of the composition of the present invention is excellent in heat resistance, cold resistance and electric insulating properties similarly in the cured product of the usual addition curable silicone composition. The photosemiconductor device (optical device) encapsulated by the encapsulant comprising the composition of the present invention may be mentioned, for example, LED, semiconductor laser, a photodiode, a phototransistor, a solar battery, CCD, etc. The encapsulant comprising the composition of the present invention is coated onto such a photosemiconductor device, and the coated encapsulant is cured under the conventionally known curing conditions by the conventionally known method, specifically by the method as mentioned above, a photosemiconductor apparatus in which a photosemiconductor device has been encapsulated can be obtained. For example, in an emission semiconductor apparatus (photosemiconductor apparatus) 10 shown in FIG. 1, an emission device (photosemiconductor device) 2 is die bonded to a cabinet 1 through a die bonding material 5. A gold wire 6 is connected to lead electrodes 3 and 4, and the emission device (photosemiconductor device) 2 and the gold wire 6 are encapsulated by an encapsulating resin 7 which is a cured product of the composition of the present invention.

EXAMPLES

In the following, the present invention is specifically explained by referring to Examples and Comparative Examples, but the present invention is not limited by the following mentioned Examples, etc. Incidentally, in the following mentioned examples, the symbols showing an average composition of silicone oil or a silicone resin shows the unit as mentioned below. In addition, a molar number of each silicone oil or each silicone resin shows a molar number of a vinyl group or a SiH group contained in each component.

$M^H$: $(CH_3)_2HSiO_{1/2}$ $M^{Vi}$: $(CH_2=CH)(CH_3)_2SiO_{1/2}$ $D^H$: $(CH_3)HSiO_{2/2}$ $D^F$: $CF_3(CH_2)_2CH_3SiO_{2/2}$ $D^{Vi}$: $(CH_2=CH)(CH_3)SiO_{2/2}$

T: $CH_3SiO_{3/2}$ $T^F$: $CF_3(CH_2)_2SiO_{3/2}$ $T^{F13}$: $CF_3(CF_2)_5(CH_2)_2SiO_{3/2}$ $D^{F13}$: $CF_3(CF_2)_5(CH_2)_2CH_3SiO_{2/2}$

Formulation Example 1

Component (A)

(Component (A-1)) 50 parts by mass of silicone oil having an average compositional formula: $M^{Vi}_2D^F_{22.7}$, (Component (A-2)) 50 parts by mass of a silicone resin having an average compositional formula: $D^{Vi}_2T^F_8$, (Component (B)) 5.4 parts by mass of hydrogen siloxane represented by an average compositional formula: $M^H_3T^F$, and 5.4 parts by mass of hydrogen siloxane represented by the following formula (V), (Component (C)) 0.25 parts by mass of a toluene solution containing chloroplatinic acid/1,3-divinyltetramethyl-disiloxane complex which contains 1% by mass as a platinum atom content were stirred well to prepare Silicone composition 1.

Formulation Example 2

Component (A)

(Component (A-1)) 90 parts by mass of silicone oil having an average compositional formula: $M^{Vi}_2D^{F13}_4D^F_{12}$, (Component (A-2)) 10 parts by mass of a silicone resin having an average compositional formula: $D^{Vi}_2T_9T^{F13}_6$, (Component (B))

(Component (B) 12.3 parts by mass of hydrogen siloxane represented by an average compositional formula: $M^H_3T^{F13}$, (Component (C)) 0.1 parts by mass of a toluene solution containing chloroplatinic acid/1,3-divinyltetramethyl-disiloxane complex which contains 0.5% by mass as a platinum atom content and 0.01 part by mass of ethynylcyclohexanol as a controller were stirred well to prepare Silicone composition 2.

Example 1

With 100 parts by mass of the composition of Formulation Example 1 was uniformly mixed 5.0 parts by mass of silicone complex powder (available from Shin-Etsu Chemical Co., Ltd., product name: KMP-600, average particle diameter: 5 µm) to prepare Composition (a).

Example 2

With 100 parts by mass of the composition of Formulation Example 1 was uniformly mixed 5.0 parts by mass of silicone resin powder (available from Shin-Etsu Chemical Co., Ltd., product name: X-52-1621, average particle diameter: 5 µm) to prepare Composition (b).

Example 3

With 100 parts by mass of the composition of Formulation Example 2 was uniformly mixed 5.0 parts by mass of silicone complex powder (available from Shin-Etsu Chemical Co., Ltd., product name: KMP-600, average particle diameter: 5 µm) to prepare Composition (c).

Example 4

With 100 parts by mass of the composition of Formulation Example 2 was uniformly mixed 5.0 parts by mass of silicone resin powder (available from Shin-Etsu Chemical Co., Ltd., product name: X-52-1621, average particle diameter: 5 µm) to prepare Composition (d).

Comparative Example 1

The composition of Formulation Example 1 was used as such without adding silicone powder to prepare Composition (e).

Comparative Example 2

The composition of Formulation Example 2 was used as such without adding silicone powder to prepare Composition (f).

Comparative Example 3

With 100 parts by mass of the composition of Formulation Example 1 was uniformly mixed 5.0 parts by mass of rubber powder (available from Shin-Etsu Chemical Co., Ltd., product name: KMP-590, average particle diameter: 5 μm) to prepare Composition (g).

Comparative Example 4

With 100 parts by mass of the composition of Formulation Example 1 was uniformly mixed 5.0 parts by mass of silicone resin powder (available from Shin-Etsu Chemical Co., Ltd., crude grains of product name: X-52-854 were cut to make an average particle diameter of 0.4 μm) to prepare Composition (h).

Comparative Example 5

With 100 parts by mass of the composition of Formulation Example 1 was uniformly mixed 600 parts by mass of silicone resin powder (available from Shin-Etsu Chemical Co., Ltd., product name: X-52-1621, average particle diameter: 5 μm) to prepare Composition (i).

The silicone compositions (a) to (i) prepared in the above-mentioned Examples and Comparative Examples were evaluated according to the following manner.

[Evaluation Method]
Photosemiconductor Package

Figure 1:
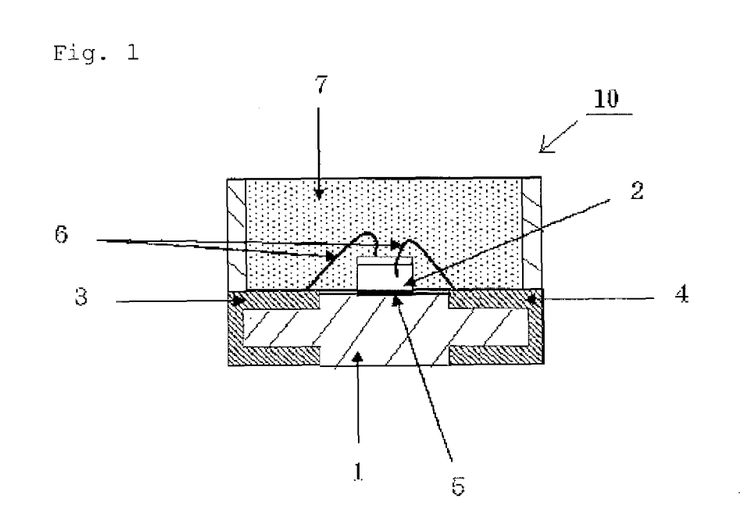
FIG. 1 is a sectional view showing one example of a photosemiconductor apparatus of the present invention.

An emission semiconductor apparatus (photosemiconductor apparatus) 10 having the structure shown in FIG. 1 was used, wherein LED chips as photosemiconductor devices, having an emission layer comprising InGaN and exhibiting a main emission peak of 450 nm had been each mounted on a SMD3020 package and a SMD5050 package (manufactured by I-CHIUN PRECISION INDUSTRY CO., resin portion: PPA), and wire bonded. Here, in FIG. 1, as mentioned above, the reference numeral 1 is a cabinet, 2 is an emission device (photosemiconductor device), 3 and 4 are lead electrodes, 5 is a die bonding material, 6 is a gold wire, and 7 is an encapsulating resin. The curing conditions of the encapsulating resin 7 are at 150° C. for 4 hours. As the encapsulating resin 7, the above-mentioned compositions (a) to (i) were used and evaluated.

Total luminous flux value of the ten emission semiconductor apparatuses prepared were measured by using total luminous flux measurement system HM-9100 (manufactured by Otsuka Electronics Co., Ltd.), and an average value thereof was obtained (Applied electric current IF=20 mA). To evaluate the degree of the light extraction efficiency by the addition of the respective silicone powders, the values measured as mentioned above were compared to each other (the following equation). (Light extraction efficiency)={(Total luminous flux value after adding powder)/(Total luminous flux value before adding powder)}×100−100 (point)

As can be seen from the above formula, the light extraction efficiency means that it is well-lighted as compared with the standard when the value takes a positive value, and it is dark as compared with the standard when the value takes a negative value.

Reflow Crack Resistance

Five emission semiconductor apparatuses produced were exposed under the conditions of 260° C. for 3 minutes, and a number of the LEDs in which cracks were generated and it was not lighted is counted. That is, when the numerical value is 0, it is excellent in crack resistance at the time of reflow, and when it is 5, all the packages were not lighted which mean it is inferior in reliability.

These results are shown in Table 1.

TABLE 1

| | | Examples | | | | Comparative Examples | | | | |
|---|---|---|---|---|---|---|---|---|---|---|
| | | 1 | 2 | 3 | 4 | 1 | 2 | 3 | 4 | 5 |
| Composition | | a | b | c | d | e | f | g | h | i |
| Kind of silicone powder | | Complex | Resin | Complex | Resin | None | None | Rubber powder | Resin | Resin |
| Formulation amount (parts by mass) of silicone powder | | 5 | 5 | 5 | 5 | 0 | 0 | 5 | 5 | 600 |
| Average particle diameter (μm) of silicone powder | | 5 | 5 | 5 | 5 | — | — | 5 | 0.4 | 5 |
| Dispense workability | | Good | Good | Good | Good | Good | Good | Bad | Good | Bad |
| Number of cracks at reflow | | 0 | 0 | 0 | 0 | 5 | 5 | — | 0 | — |
| Light extraction efficiency (%) | 3020 package | 1.0 | 2.0 | 1.4 | 2.6 | ±0 (Standard) | +0.4 | — | −28 | — |
| | 5050 package | 2.8 | 2.5 | 2.8 | 2.8 | ±0 (Standard) | +0.2 | — | −31 | — |

As shown in Table 1, Examples 1 and 2 were materials excellent in light extraction efficiency. Further, dispensing characteristics and reflow crack resistance thereof were good, and these were excellent in product reliability. In addition, as shown in Examples 3 and 4, which were the cases using a polyorganosiloxane having $CF_3(CF_2)_5(CH_2)_2$, light extraction efficiency was also excellent, and dispensing characteristics and reflow crack resistance thereof were good.

On the other hand, Comparative Example 1 showed low light extraction efficiency as compared with those of Examples 1 and 2. Further, crack failure was generated by reflow, and it could be understood that reliability of the LED became worse when the conventional material was used as the encapsulating material.

In Comparative Example 2, light extraction efficiency was low as compared with those of Examples 3 and 4. Further, crack failure was generated by reflow, and it could be understood that reliability of the LED became worse when the conventional material was used as the encapsulating material.

Comparative Example 4 is the case where silicone powder having a small average particle diameter was added, and light extraction efficiency after adding the silicone powder was lowered. According to this sample, it could be understood that brightness of the LED became worse when the conventional material was used as the encapsulating material.

Comparative Example 3 and Comparative Example 5 generated clogging of nozzles at the time of dispensing, so that stable coating to the package could not be carried out.

According to the above results, it could be verified that the curable silicone resin compositions of the present invention were excellent in light extraction efficiency and capable of suppressing cracks at the reflow process, and were materials useful as an encapsulating material for the LED.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

The invention claimed is:

1. A curable silicone resin composition which is an addition-curable silicone composition and comprises
(A)
(A-1) a compound having at least two aliphatic unsaturated groups per one molecule and represented by the following formula (1), wherein $R^1$ represents an aliphatic unsaturated group, $R^2$s may be the same or different from each other and each represent a substituted or unsubstituted monovalent hydrocarbon group having 1 to 8 carbon atoms other than an aliphatic unsaturated group, $Rf^1$ represents a $CF_3—(CF_2)_m—(CH_2)_n—$ group
where "m" represents an integer of 0 or more, and "n" represents an integer of 1 or more,
"a" represents an integer of 1 to 3, and "x", "y" and "z" are each an integer of $x≥0$, $y≥1$ and $z≥0$, respectively,
(B) an organic silicon compound having at least two hydrogen atoms bonded to silicon atom per one molecule and having no aliphatic unsaturated group,
(C) a hydrosilylation catalyst containing a platinum group metal, and
(D) 0.1 to 500 parts by mass of silicone powder having an average particle diameter of 0.5 to 100 μm based on 100 parts by mass of the total Components (A) and (B).

2. The curable silicone resin composition according to claim 1, wherein Component (A) further contains, in addition to Component (A-1), (A-2) an organopolysiloxane having two or more aliphatic unsaturated groups bonded to a silicon atom and one or more $CF_3—(CF_2)_m—(CH_2)_n—$ group bonded to a silicon atom in one molecule, and having a branched structure of a siloxane unit represented by $SiO_{4/2}$ and/or $RSiO_{3/2}$, where "m" and "n" have the same meanings as defined above, R represents a substituted or unsubstituted monovalent hydrocarbon group, and when there are a plural number of siloxane units having R, then Rs may be the same or different groups from each other.

3. The curable silicone resin composition according to claim 1, wherein Component (D) is silicone powder containing a polyorganosilsesquioxane resin.

4. The curable silicone resin composition according to claim 2, wherein Component (D) is silicone powder containing a polyorganosilsesquioxane resin.

5. The curable silicone resin composition according to claim 1, wherein m=0 and n=2 in the $CF_3—(CF_2)_m—(CH_2)_n—$ group.

6. The curable silicone resin composition according to claim 2, wherein m=0 and n=2 in the $CF_3—(CF_2)_m—(CH_2)_n—$ group.

7. The curable silicone resin composition according to claim 3, wherein m=0 and n=2 in the $CF_3—(CF_2)_m—(CH_2)_n—$ group.

8. The curable silicone resin composition according to claim 4, wherein m=0 and n=2 in the $CF_3—(CF_2)_m—(CH_2)_n—$ group.

9. The curable silicone resin composition according to claim 1, wherein Component (B) is an organohydrogen polysiloxane represented by the following average compositional formula (2), wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7≤a'≤2.1$, $0.001≤b≤1.0$, and $0.8≤a'+b≤3.0$.

10. The curable silicone resin composition according to claim 2, wherein Component (B) is an organohydrogen polysiloxane represented by the following average compositional formula (2), wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7≤a'≤2.1$, $0.001≤b≤1.0$, and $0.8≤a'+b≤3.0$.

11. The curable silicone resin composition according to claim 3, wherein Component (B) is an organohydrogen polysiloxane represented by the following average compositional formula (2), wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7≤a'≤2.1$, $0.001≤b≤1.0$, and $0.8≤a'+b≤3.0$.

12. The curable silicone resin composition according to claim 4, wherein Component (B) is an organohydrogen polysiloxane represented by the following average compositional formula (2), $$R^3_{a'}H_bSiO_{(4-a'-b)/2} \quad (2)$$

wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7 \leq a' \leq 2.1$, $0.001 \leq b \leq 1.0$, and $0.8 \leq a' + b \leq 3.0$.

13. The curable silicone resin composition according to claim 5, wherein Component (B) is an organohydrogen polysiloxane represented by the following average compositional formula (2), $$R^3_{a'}H_bSiO_{(4-a'-b)/2} \quad (2)$$

wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7 \leq a' \leq 2.1$, $0.001 \leq b \leq 1.0$, and $0.8 \leq a' + b \leq 3.0$.

14. The curable silicone resin composition according to claim 6, wherein Component (B) is an organohydrogen polysiloxane represented by the following average compositional formula (2), $$R^3_{a'}H_bSiO_{(4-a'-b)/2} \quad (2)$$

wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7 \leq a' \leq 2.1$, $0.001 \leq b \leq 1.0$, and $0.8 \leq a' + b \leq 3.0$.

15. The curable silicone resin composition according to claim 7, wherein Component (B) is an organohydrogen polysiloxane represented by the following average compositional formula (2), $$R^3_{a'}H_bSiO_{(4-a'-b)/2} \quad (2)$$

wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7 \leq a' \leq 2.1$, $0.001 \leq b \leq 1.0$, and $0.8 \leq a' + b \leq 3.0$.

16. The curable silicone resin composition according to claim 8, wherein Component (B) is an organohydrogen polysiloxane represented by the following average compositional formula (2), $$R^3_{a'}H_bSiO_{(4-a'-b)/2} \quad (2)$$

wherein $R^3$s may be the same or different from each other, and each represent a substituted or unsubstituted silicon atom-bonded monovalent hydrocarbon group other than an aliphatic unsaturated group, and "a'" and "b" are each a positive number satisfying $0.7 \leq a' \leq 2.1$, $0.001 \leq b \leq 1.0$, and $0.8 \leq a' + b \leq 3.0$.

17. The curable silicone resin composition according to claim 1, wherein the curable silicone resin composition is used as a material for encapsulating a photosemiconductor device.

18. A cured product which comprises a material obtained by curing the curable silicone resin composition according to claim 1.

19. A photosemiconductor apparatus which comprises encapsulating a photosemiconductor device by using the curable silicone resin composition according to claim 1 and curing by heating.

* * * * *